United States Patent
Tanaka et al.

(10) Patent No.: US 10,996,395 B2
(45) Date of Patent: May 4, 2021

(54) OPTO-ELECTRIC HYBRID BOARD

(71) Applicant: NITTO DENKO CORPORATION, Ibaraki (JP)

(72) Inventors: Naoyuki Tanaka, Ibaraki (JP); Yasuto Ishimaru, Ibaraki (JP); Yuichi Tsujita, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/473,799

(22) PCT Filed: Nov. 28, 2017

(86) PCT No.: PCT/JP2017/042473
§ 371 (c)(1),
(2) Date: Jun. 26, 2019

(87) PCT Pub. No.: WO2018/123389
PCT Pub. Date: Jul. 5, 2018

(65) Prior Publication Data
US 2019/0324200 A1 Oct. 24, 2019

(30) Foreign Application Priority Data

Dec. 28, 2016 (JP) .............................. JP2016-254717

(51) Int. Cl.
*G02B 6/12* (2006.01)
*G02B 6/122* (2006.01)
(Continued)

(52) U.S. Cl.
CPC .......... *G02B 6/122* (2013.01); *G02B 6/12002* (2013.01); *G02B 6/13* (2013.01);
(Continued)

(58) Field of Classification Search
CPC ...... G02B 6/122; G02B 6/12002; G02B 6/13; G02B 6/4214; G02B 2006/12083; H05K 1/0274
(Continued)

(56) References Cited

U.S. PATENT DOCUMENTS 6,477,296 B1  11/2002  Ogawa
6,647,032 B1  11/2003  Lee et al.
(Continued)

FOREIGN PATENT DOCUMENTS

CN  1423140 A  6/2003
CN  1437033 A  8/2003
(Continued)

OTHER PUBLICATIONS

Notification of Transmittal of Translation of the International Preliminary Report on Patentability (Form PCT/IB/338) issued in counterpart International Application No. PCT/JP2017/042473 dated Jul. 11, 2019 with Forms PCT/IB/373 and PCT/ISA/237. (7 pages).
(Continued)

*Primary Examiner* — Jerry M Blevins
(74) *Attorney, Agent, or Firm* — Westerman, Hattori, Daniels & Adrian, LLP

(57) ABSTRACT

There is provided an opto-electric hybrid board with slight or no warpage. An opto-electric hybrid board according to the present disclosure includes an electric circuit board and an optical waveguide formed in a stacked manner on one surface of the electric circuit board. The optical waveguide includes an under cladding layer, cores for an optical path formed on a front surface of the under cladding layer, and over cladding layer formed on the front surface of the under cladding layer so as to cover the cores. A groove for prevention of warpage which has a bottom positioned below
(Continued)

a top surface of the cores is formed at least in a front surface portion of the over cladding layer.

3 Claims, 6 Drawing Sheets

(51) Int. Cl.
    *G02B 6/13*        (2006.01)
    *G02B 6/42*        (2006.01)
    *H05K 1/02*        (2006.01)

(52) U.S. Cl.
    CPC ......... *G02B 6/4214* (2013.01); *H05K 1/0274* (2013.01); *G02B 2006/12083* (2013.01)

(58) Field of Classification Search
    USPC .......................................................... 385/14
    See application file for complete search history.

(56) References Cited

U.S. PATENT DOCUMENTS

| | | |
|---|---|---|
| 7,290,407 B1 | 11/2007 | Shan |
| 2003/0152354 A1 | 8/2003 | Uchida |
| 2004/0228570 A1 | 11/2004 | Logvin et al. |
| 2008/0166096 A1 | 7/2008 | Hikita |
| 2009/0142026 A1* | 6/2009 | Shioda ................ G02B 6/1221 385/131 |
| 2009/0169152 A1 | 7/2009 | Ostergard |
| 2009/0317048 A1 | 12/2009 | Shioda et al. |
| 2011/0286701 A1 | 11/2011 | Mune et al. |
| 2015/0285995 A1 | 10/2015 | Yamamoto |
| 2019/0107674 A1* | 4/2019 | Ohara ................ G02B 6/1221 |

FOREIGN PATENT DOCUMENTS

| | | |
|---|---|---|
| CN | 101218527 A | 7/2008 |
| CN | 101221266 A | 7/2008 |
| CN | 102262269 A | 11/2011 |
| CN | 104792418 A | 7/2015 |
| JP | 1-156692 A | 6/1989 |
| JP | 2000-227524 A | 8/2000 |
| JP | 2005-4187 A | 1/2005 |
| JP | 2008-170524 A | 7/2008 |
| JP | 2012-133241 A | 7/2012 |
| JP | 2015-200785 A | 11/2015 |
| WO | 2007/132751 A1 | 11/2007 |

OTHER PUBLICATIONS

Office Action dated Mar. 10, 2020, issued in counterpart CN application No. 201780080829.9, with English translation. (13 pages).
Office Action dated Jun. 23, 2020, issued in counterpart JP Application No. 2016-254717, with English Translation. (6 pages).
Office Action, dated Nov. 4, 2020, issued in counterpart Japanese Patent No. 2016-254717 (w/ English translation, 5 pages).
International Search Report dated Feb. 20, 2018, issued in counterpart International Application No. PCT/JP2017/042473 (2 pages).
Office Action, dated Jan. 19, 2021, issued in counterpart Japanese Patent No. 2016-254717 (w/ English translation, 4 pages).

* cited by examiner

OPTO-ELECTRIC HYBRID BOARD

TECHNICAL FIELD

The present disclosure relates to an opto-electric hybrid board including an electric circuit board and an optical waveguide formed in a stacked manner on the electric circuit board.

BACKGROUND ART

With the increase in the amount of transmission information, optical interconnect lines have been used in addition to or in combination with electrical interconnect lines in recent electronic devices and the like. As an example, an opto-electric hybrid board in which an optical waveguide is formed in a stacked manner on an electric circuit board has been proposed (see PTL 1, for example). The electric circuit board includes an insulative substrate and electrical interconnect lines formed on a back surface (a first surface) of the insulative substrate. The optical waveguide is formed on a front surface (a second surface on the side opposite from the first surface) of the insulative substrate, and includes an under cladding layer formed on the front surface of the insulative substrate, cores (optical interconnect lines) patterned on a front surface of the under cladding layer, and an over cladding layer formed on the front surface of the under cladding layer so as to cover the cores.

A light-emitting element and a light-receiving element are mounted on part of the electrical interconnect lines of the opto-electric hybrid board by ultrasonic mounting. Light emitted from the light-emitting element passes through the cores of the optical waveguide and is then received by the light-receiving element, whereby light propagation is achieved.

RELATED ART DOCUMENT

Patent Document

PTL 1: JP-A-2012-133241

SUMMARY

However, there are some cases in which the opto-electric hybrid board is warped, with the optical waveguide facing inward. As a result of the investigation into the cause of the warpage, the present inventors have found that the cause lies in the fact that the over cladding layer shrinks on curing when the over cladding layer of the optical waveguide is formed in the production of the opto-electric hybrid board. The over cladding layer is large in volume due to the necessity to cover a core. For covering a plurality of cores together, the over cladding layer becomes larger in volume and accordingly shrinks on curing in greater amounts. If the light-emitting element and the like are mounted by ultrasonic mounting, with the opto-electric hybrid board warped in this manner, the light-emitting element and the like cannot be properly pressed against the opto-electric hybrid board, and ultrasonic vibrations are not properly transmitted, so that the light-emitting element and the like are not properly mounted. As a result, the light-emitting element and the like fall off the opto-electric hybrid board later in some cases. Also, even if the light-emitting element and the like are mounted by ultrasonic mounting, with the warped opto-electric hybrid board forcedly pressed down to flatten, the opto-electric hybrid board is warped again after the pressure is released. At this time, the light-emitting element and the like fall off the opto-electric hybrid board in some cases.

In view of the foregoing, it is therefore an object of the present disclosure to provide an opto-electric hybrid board with slight or no warpage.

An opto-electric hybrid board according to the present disclosure comprises: an electric circuit board; and an optical waveguide formed in a stacked manner on one surface of the electric circuit board, the optical waveguide including a core for an optical path and an over cladding layer covering the core, wherein a groove having a bottom positioned below a top surface of the core is formed at least in a front surface portion of the over cladding layer.

In the opto-electric hybrid board according to the present disclosure, the optical waveguide is formed in a stacked manner on the electric circuit board, and the groove having a bottom positioned below the top surface of the core (positioned on the opposite side of the top surface of the core from the front surface of the over cladding layer) is formed at least in the front surface portion of the over cladding layer. Thus, when the over cladding layer is formed, the volume of the over cladding layer is reduced by the amount of the groove due to the formation of the groove. That is, the amount of shrinkage on curing of the over cladding layer is accordingly smaller because the volume of the over cladding layer which shrinks on curing is smaller. Also, at least the front surface portion of the over cladding layer is divided into sections by the formation of the groove. This causes the shrinkage on curing of the front surface portion of the over cladding layer to occur for each of the divided sections. In each of the divided sections, the amount of shrinkage on curing is reduced because the volume of the over cladding layer which shrinks on curing is reduced. For these reasons, slight or no warpage occurs in the opto-electric hybrid board in which the electric circuit board and the optical waveguide are stacked together. Thus, the opto-electric hybrid board according to the present disclosure is excellent in mountability during the mounting of optical elements such as a light-emitting element and a light-receiving element by ultrasonic mounting or the like. As a result, the mounted optical elements do not fall off later.

In the case where a longitudinal direction of the groove extends in a longitudinal direction of the core, the amount of shrinkage of the over cladding layer is further reduced because the volume of the over cladding layer is reduced with an increase in the length of the groove. Thus, slighter or no warpage occurs in the opto-electric hybrid board according to the present disclosure. Therefore, the opto-electric hybrid board according to the present disclosure is more excellent in mountability of the optical elements.

In particular, in the case where the optical waveguide further includes an under cladding layer formed on the one surface of the electric circuit board, where the core and the over cladding layer are formed on a front surface of the under cladding layer, and where the under cladding layer has a side end portion not covered with the over cladding layer but exposed, the amount of shrinkage is reduced because the volume of the over cladding layer is reduced by the amount of the uncovered side end portion of the under cladding layer. Thus, slighter or no warpage occurs in the opto-electric hybrid board according to the present disclosure. Therefore, the opto-electric hybrid board according to the present disclosure is more excellent in mountability of the optical elements.

In the case where warpage in the opto-electric hybrid board has a radius of curvature of not less than 35 mm, very slight or no warpage occurs in the opto-electric hybrid board. Therefore, the opto-electric hybrid board according to the present disclosure is further improved in mountability of the optical elements.

DESCRIPTION OF EMBODIMENTS

Next, embodiments according to the present disclosure will now be described in detail with reference to the drawings.

Figure 1:
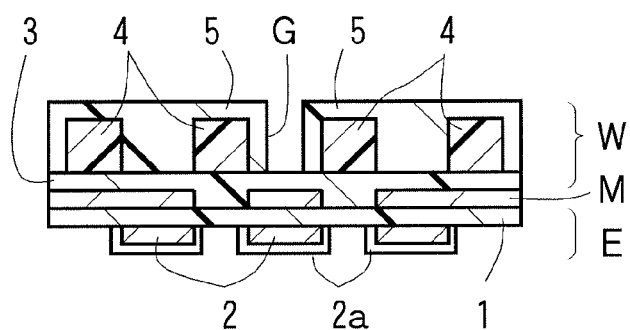
FIG. 1 is a schematic cross-sectional view of a first embodiment of an opto-electric hybrid board according to the present disclosure.

FIG. 1 is a cross-sectional view (a sectional view orthogonal to a longitudinal direction of cores) of a first embodiment of an opto-electric hybrid board according to the present disclosure. The opto-electric hybrid board according to the first embodiment includes an electric circuit board E and an optical waveguide W formed in a stacked manner on one surface (an upper surface as seen in FIG. 1) of the electric circuit board E. In this embodiment, a metal layer M for reinforcement is partially disposed between the electric circuit board E and the optical waveguide W. A groove G for prevention of warpage is formed in an over cladding layer 5 in the optical waveguide W and extends in a longitudinal direction of cores 4 in the optical waveguide W. A feature of the present disclosure lies in that the groove G for prevention of warpage is formed in the over cladding layer 5 in this manner. In this embodiment, the groove G has a bottom corresponding to a front surface of an under cladding layer 3 in the optical waveguide, and divides the over cladding layer 5 into a plurality of segments.

More specifically, the electric circuit board E includes: an insulative layer 1; electrical interconnect lines 2 formed on aback surface (a lower surface as seen in FIG. 1) of the insulative layer 1; and coverlays 2a covering the electrical interconnect lines 2. The insulative layer 1 is formed on a back surface (a lower surface as seen in FIG. 1) of the metal layer M.

The optical waveguide W in this embodiment includes: one under cladding layer 3; a plurality of (four as seen in FIG. 1) cores 4 for an optical path patterned on the front surface (the upper surface as seen in FIG. 1) of the under cladding layer 3; and an over cladding layer 5 consisting of plurality of segments thereof (two as seen in FIG. 1) patterned so as to cover the cores 4 in groups (in groups of two for each of the segments as seen in FIG. 1). That is, the groove G having the bottom corresponding to the front surface of the under cladding layer 3 lies between the adjacent segments of the over cladding layer 5. The groove G divides the over cladding layer 5 into segments (a pair of left-hand and right-hand segments of the over cladding layer 5 extends in the longitudinal direction of the cores 4 as seen in FIG. 1). The under cladding layer 3 is formed on a front surface (an upper surface as seen in FIG. 1) of the metal layer M. The under cladding layer 3 fills areas where the metal layer M is not disposed between the electric circuit board E and the optical waveguide W.

Next, a method of manufacturing the aforementioned opto-electric hybrid board will be described.

[Formation of Electric Circuit Board E of Opto-Electric Hybrid Board]

First, a metal sheet material Ma (with reference to FIG. 2A) for the formation of the metal layer M is prepared. Examples of a material for the formation of the metal sheet material Ma include stainless steel and 42 alloy (an alloy of iron and nickel, wherein a content of the nickel is 42%). In particular, stainless steel is preferable from the viewpoint of dimensional accuracy and the like. The metal sheet material Ma (the metal layer M) has a thickness in the range of 10 to 100 μm, for example.

Figure 2A:
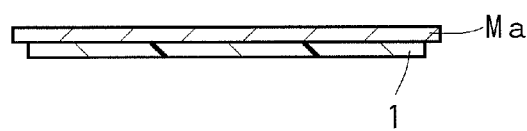
FIGS. 2A to 2C are illustrations schematically showing the steps of forming an electrical circuit board in the opto-electric hybrid board.

Next, as shown in FIG. 2A, a photosensitive insulating resin is applied to a back surface (a lower surface as seen in the figure) of the metal sheet material Ma to form the insulative layer 1 having a predetermined pattern by a photolithographic process. Examples of a material for the formation of the insulative layer 1 include: synthetic resins such as polyimide, polyether nitrile, polyethersulfone, polyethylene terephthalate, polyethylene naphthalate, and polyvinyl chloride; and silicone sol-gel materials. The insulative layer 1 has a thickness in the range of 10 to 100 μm, for example. The back surface of the metal sheet material Ma faces upward in this step of forming the insulative layer 1 and in the subsequent step of forming the electrical interconnect lines 2.

Figure 2B:
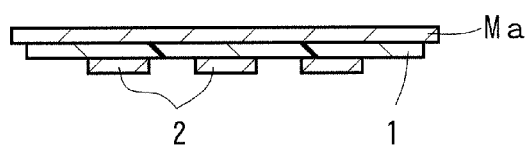

Next, as shown in FIG. 2B, the electrical interconnect lines 2 are formed by a semi-additive process or a subtractive process, for example.

Figure 2C:
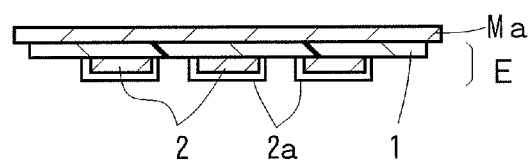

Next, as shown in FIG. 2C, a photosensitive insulating resin including a polyimide resin or the like is applied to portions of the electrical interconnect lines 2 to thereby form the coverlays 2a by a photolithographic process. In this manner, the electric circuit board E is formed on the back surface of the metal sheet material Ma.

[Formation of Metal Layer M of Opto-Electric Hybrid Board]

Figure 2D:
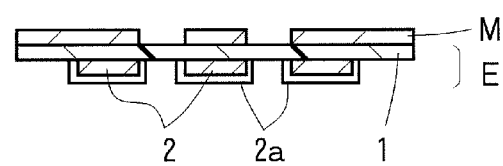
FIG. 2D is an illustration schematically showing the step of forming a metal layer in the opto-electric hybrid board.

Thereafter, as shown in FIG. 2D, etching or the like is performed on the metal sheet material Ma to remove unnecessary portions of the metal sheet material Ma and to arrange the shape of the metal sheet material Ma. In this manner, the metal sheet material Ma is formed into the metal layer M.

[Formation of Optical Waveguide W of Opto-Electric Hybrid Board]

Figure 3A:
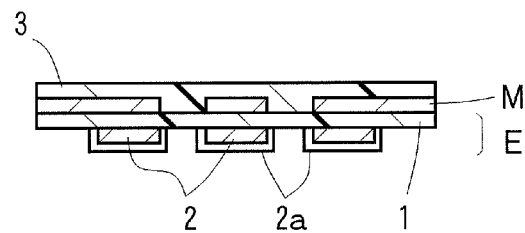
FIGS. 3A to 3C are illustrations schematically showing the steps of forming an optical waveguide in the opto-electric hybrid board.

For the formation of the optical waveguide W (with reference to FIG. 1) on the front surface (the surface on the side opposite from the electric circuit board E) of the metal layer M, a photosensitive resin which is a material for the formation of the under cladding layer 3 is initially applied to the front surface (the upper surface as seen in the figure) of the metal layer M, and the applied layer is formed into the single under cladding layer 3 by a photolithographic process, as shown in FIG. 3A. The under cladding layer 3 has a thickness (a thickness as measured from the front surface of the metal layer M) in the range of 5 to 80 μm, for example.

Figure 3B:
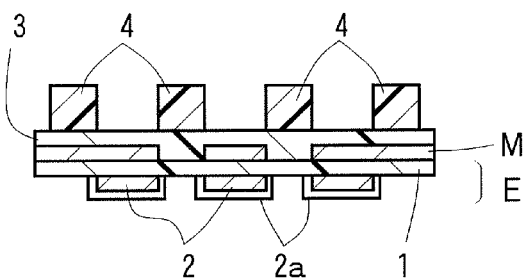

Next, as shown in FIG. 3B, a photosensitive resin which is a material for the formation of the cores 4 is applied to the front surface (the upper surface as seen in the figure) of the under cladding layer 3, and the applied layer is patterned into the cores 4 by a photolithographic process. The cores 4 have the following dimensions: a width in the range of 20 to 100 μm and a thickness in the range of 20 to 100 μm, for example. The cores 4 have a refractive index higher than the refractive indices of the aforementioned under cladding layer 3 and the over cladding layer 5 to be described below (with reference to FIG. 3C).

Figure 3C:
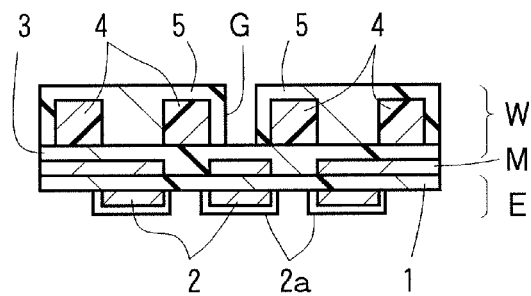

Then, as shown in FIG. 3C, a photosensitive resin which is a material for the formation of the over cladding layer 5 is applied to the front surface (the upper surface as seen in the figure) of the under cladding layer 3 so as to cover the cores 4, and the applied layer is patterned into the segments of the over cladding layer 5 by a photolithographic process. In this patterning process, the groove G having the bottom corresponding to the front surface of the under cladding layer 3 is formed between the adjacent segments of the over cladding layer 5 so as to extend in the longitudinal direction of the cores 4. The over cladding layer 5 has a thickness (a thickness as measured from a top surface of the cores 4) in the range of 3 to 50 μm, for example. The groove G has a width in the range of 10 to 30000 μm, for example. An example of the material for the formation of the over cladding layer 5 includes a photosensitive resin similar to that for the under cladding layer 3. In this manner, the optical waveguide W is formed on the front surface (the upper surface as seen in the figure) of the metal layer M.

Then, the opto-electric hybrid board shown in FIG. 1 is provided. In this opto-electric hybrid board in which the groove G is formed in the over cladding layer 5, the volume of the over cladding layer 5 is smaller by the amount of the groove G. That is, the amount of shrinkage on curing of the over cladding layer 5 is accordingly smaller because the volume of the over cladding layer 5 which shrinks on curing is smaller. Also, at least a front surface portion of the over cladding layer 5 is divided into sections by the formation of the groove G. This causes the shrinkage on curing of the front surface portion of the over cladding layer 5 to occur for each of the divided sections. In each of the divided sections, the amount of shrinkage on curing is reduced because the volume of the over cladding layer 5 which shrinks on curing is reduced. For these reasons, slight or no warpage occurs in the opto-electric hybrid board in which the electric circuit board E and the optical waveguide W are stacked together. In particular, slight or no warpage occurs in a width direction (a horizontal direction as seen in FIG. 1) of the opto-electric hybrid board in this embodiment. That is, the groove G is provided for prevention of warpage of the opto-electric hybrid board. The opto-electric hybrid board, in which slight or no warpage occurs as described above, is excellent in mountability during the mounting of optical elements such as a light-emitting element and a light-receiving element by ultrasonic mounting or the like in a subsequent element mounting step. As a result, the mounted optical elements do not fall off later.

Figure 4:
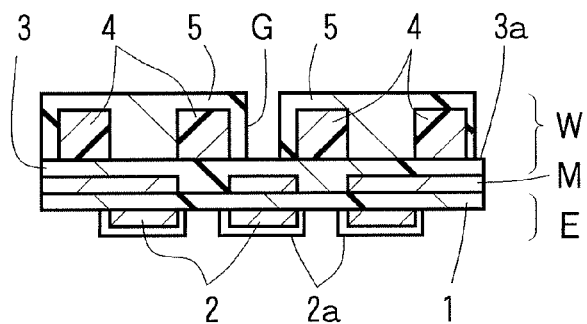
FIG. 4 is a schematic cross-sectional view of a second embodiment of the opto-electric hybrid board according to the present disclosure.

FIG. 4 is a cross-sectional view of a second embodiment of the opto-electric hybrid board according to the present disclosure. The opto-electric hybrid board according to the second embodiment is configured such that the front surface of the under cladding layer 3 in the first embodiment shown in FIG. 1 has a side end portion 3a (a right-hand side end portion of the front surface as seen in FIG. 4) not covered with the over cladding layer 5 but exposed. The remaining parts are similar to those of the aforementioned first embodiment, and like reference numerals and characters are used to designate similar parts.

In the opto-electric hybrid board according to the second embodiment, the amount of shrinkage is reduced because the volume of the over cladding layer 5 is reduced by the amount of the uncovered side end portion of the under cladding layer 3. Thus, slighter or no warpage occurs in the opto-electric hybrid board according to the present disclosure.

Figure 5:
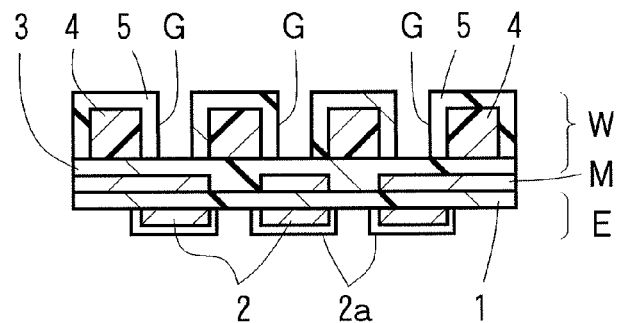
FIG. 5 is a schematic cross-sectional view of a third embodiment of the opto-electric hybrid board according to the present disclosure.

FIG. 5 is a cross-sectional view of a third embodiment of the opto-electric hybrid board according to the present disclosure. The opto-electric hybrid board according to the third embodiment is configured such that each of the cores 4 in the first embodiment shown in FIG. 1 is individually covered with a single over cladding layer 5. Thus, the groove G is defined in each space between adjacent ones of the cores 4. The remaining parts are similar to those of the aforementioned first embodiment, and like reference numerals and characters are used to designate similar parts.

In the opto-electric hybrid board according to the third embodiment, the number of grooves G dividing the over cladding layer 5 into segments is increased. Accordingly, the amount of shrinkage is further reduced because the volume of the over cladding layer 5 is further reduced. Thus, further slighter or no warpage occurs in the opto-electric hybrid board.

Figure 6:
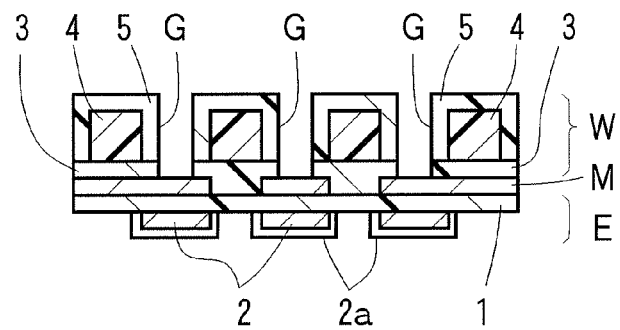
FIG. 6 is a schematic cross-sectional view of a fourth embodiment of the opto-electric hybrid board according to the present disclosure.

FIG. 6 is a cross-sectional view of a fourth embodiment of the opto-electric hybrid board according to the present disclosure. The opto-electric hybrid board according to the fourth embodiment is configured such that a plurality of segments (four as seen in FIG. 6) of an under cladding layer 3 are patterned and such that a core 4 and an over cladding layer 5 are formed on each of the segments of the under cladding layer 3 as in the third embodiment shown in FIG. 5. The remaining parts are similar to those of the aforementioned third embodiment, and like reference numerals and characters are used to designate similar parts.

In the opto-electric hybrid board according to the fourth embodiment, the under cladding layer 3 is also divided into a plurality of segments. The volume of the under cladding layer 3 is accordingly reduced. This reduces the amount of shrinkage of the under cladding layer 3 in addition to the reduction in the amount of shrinkage of the over cladding layer 5. Thus, further slighter or no warpage occurs in the opto-electric hybrid board.

Figure 7:
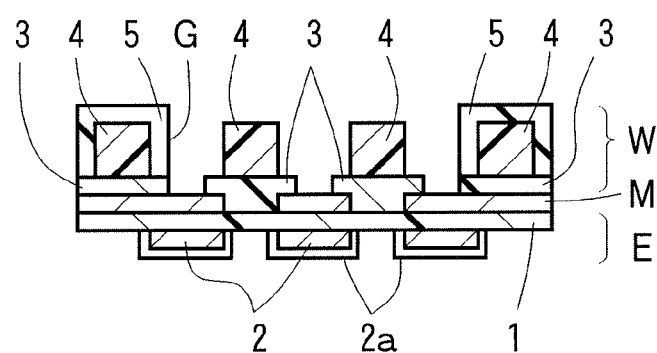
FIG. 7 is a schematic cross-sectional view of a fifth embodiment of the opto-electric hybrid board according to the present disclosure.
Figure 8A:
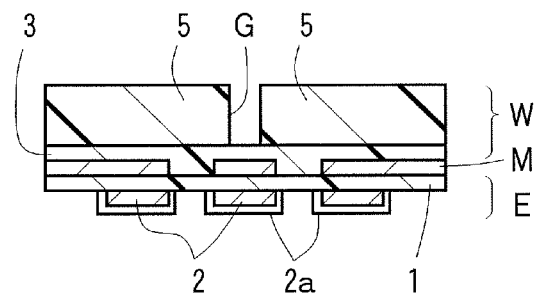
FIGS. 8A to 8D are schematic cross-sectional views of modifications of the aforementioned embodiments.
Figure 8B:
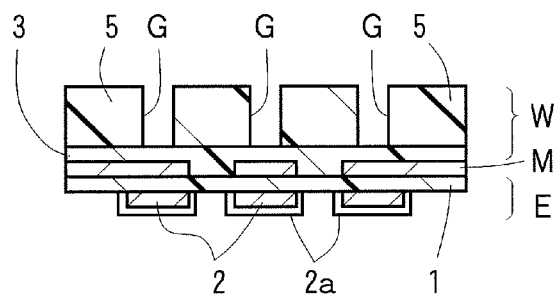
Figure 8C:
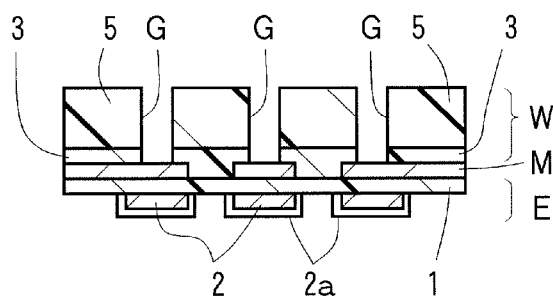
Figure 8D:
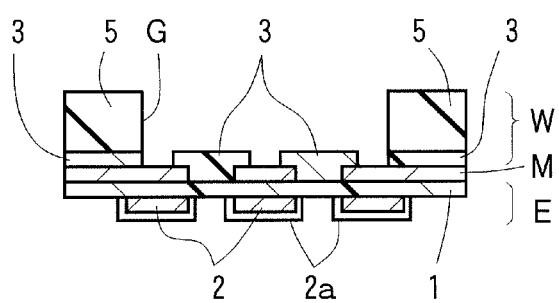

FIG. 7 is a cross-sectional view of a fifth embodiment of the opto-electric hybrid board according to the present disclosure. The opto-electric hybrid board according to the fifth embodiment is configured such that the over cladding layer 5 is not formed on at least one (two in the middle as seen in FIG. 7) segment of the under cladding layer 3 as in the fourth embodiment shown in FIG. 6. The remaining parts are similar to those of the aforementioned fourth embodiment, and like reference numerals and characters are used to designate similar parts.

In the opto-electric hybrid board according to the fifth embodiment, the over cladding layer 5 is not formed on at least one segment of the under cladding layer 3. Accordingly, the amount of shrinkage is further reduced because the volume of the over cladding layer 5 is further reduced. Thus, further slighter or no warpage occurs in the opto-electric hybrid board.

In the aforementioned embodiments, the grooves G may be formed to extend along the entire length of the over cladding layer 5 or partially in a longitudinal direction of the over cladding layer 5. Although the grooves G are formed between the cores 4 in the aforementioned embodiments, each of the grooves G may be formed between a core 4 and a side end surface of an over cladding layer 5.

In the aforementioned embodiments, the grooves G are formed so that the front surface of the under cladding layer 3 serves as the bottoms of the grooves G. However, the grooves G may be formed only in the front surface portion of the over cladding layer 5 (extending to some midpoint in the thickness direction of the over cladding layer 5) so long as the bottoms of the grooves G are below the top surfaces of the cores 4. In this case, the front surface portion of the over cladding layer 5 is divided into sections, so that the shrinkage upon curing of the front surface portion of the over cladding layer 5 occurs for each of the divided sections. In each of the divided sections, the amount of shrinkage on curing is reduced because the volume of the over cladding layer 5 which shrinks on curing is reduced. For these reasons, slighter or no warpage occurs in the aforementioned opto-electric hybrid board.

In the aforementioned embodiments, the grooves G extend in the longitudinal direction of the cores 4. However, the grooves G may extend in a direction perpendicular to or angled with respect to the longitudinal direction of the cores 4. Alternatively, a plurality of point-like holes may be formed in the front surface portion of the over cladding layer 5, and some of the holes arranged in a line may be regarded as each of the grooves G.

Further, the grooves G between adjacent ones of the cores 4 are shown as disposed in the mid-section between the adjacent cores 4 in FIG. 1 and FIGS. 4 to 7 illustrating the aforementioned embodiments. However, the grooves G may be disposed eccentrically between the adjacent cores 4.

Further, the segments of the over cladding layer 5 are shown as disposed in evenly spaced relation to the cores 4 in FIG. 1 and FIGS. 5 to 7 illustrating the first, and third to fifth embodiments. However, the segments of the over cladding layer 5 need not be evenly spaced. For example, a portion of the over cladding layer 5 which covers one side surface of a core 4 may be made longer in a width direction (a horizontal direction as seen in the figures). In that case, a side end portion of the over cladding layer 5 may protrude from a side end edge of the insulative layer 1 of the electric circuit board E.

Although the side surfaces of the under cladding layer 3 are not covered with the over cladding layer 5 in the aforementioned embodiments, the side surfaces of the under cladding layer 3 may be covered with the over cladding layer 5.

In the aforementioned embodiments, the over cladding layer 5 covering the cores 4 is formed. In some cases, however, the over cladding layer 5 is formed in areas where the under cladding layer 3 and the cores 4 are not formed or formed on the under cladding layer 3 on which the cores 4 are not formed. In these cases, it is preferable that the grooves G are formed in the over cladding layer 5 in the same manner as in the aforementioned embodiments, as shown in FIGS. 8A to 8D. It should be noted that FIGS. 8A to 8D show instances in which the under cladding layer 3 is formed.

Although the metal layer M is disposed in part of the opto-electric hybrid board in the aforementioned embodiments, an opto-electric hybrid board in which the metal layer M is not disposed may be provided.

Next, examples of the present disclosure will be described in conjunction with a comparative example. It should be noted that the present disclosure is not limited to the examples.

EXAMPLES

[Material for Formation of Under Cladding Layer and Over Cladding Layer]

Component a: 60 parts by weight of an epoxy resin (JER1002 available from Mitsubishi Chemical Corporation).

Component b: 30 parts by weight of an epoxy resin (EHPE3150 available from Daicel Corporation).

Component c: 10 parts by weight of an epoxy resin (EXA-4816 available from DIC Corporation).

Component d: 0.5 parts by weight of a photo-acid generator (CPI-101A available from San-Apro Ltd.).

Component e: 0.5 parts by weight of an antioxidant (Songnox1010 available from Kyodo Chemical Co., Ltd.).

Component f: 0.5 parts by weight of an antioxidant (HCA available from Sanko Co., Ltd.).

Component g: 50 parts by weight of ethyl lactate (a solvent).

A material for the formation of an under cladding layer and an over cladding layer was prepared by mixing these components a to g together.

[Material for Formation of Cores]

Component h: 50 parts by weight of an epoxy resin (YDCN-700-3 available from Nippon Steel & Sumikin Chemical Co., Ltd.).

Component i: 30 parts by weight of an epoxy resin (JER1002 available from Mitsubishi Chemical Corporation).

Component j: 20 parts by weight of an epoxy resin (OGSOL PG-100 available from Osaka Gas Chemicals Co., Ltd.).

Component k: 0.5 parts by weight of a photo-acid generator (CPI-101A available from San-Apro Ltd.).

Component l: 0.5 parts by weight of an antioxidant (Songnox1010 available from Kyodo Chemical Co., Ltd.).

Component m: 0.125 parts by weight of an antioxidant (HCA available from Sanko Co., Ltd.).

Component n: 50 parts by weight of ethyl lactate (a solvent).

A material for the formation of cores was prepared by mixing these components h to n together.

Example 1

Using the aforementioned materials, the opto-electric hybrid board shown in FIG. 1 was produced. This opto-electric hybrid board had an overall width of 3 mm and an overall length of 42.5 mm. A metal layer was a stainless steel layer having a thickness of 20 µm, and was disposed over the entire opto-electric hybrid board. An electric circuit board included an insulative layer having a thickness of 10 µm, and electrical interconnect lines having a thickness of 20 µm. In an optical waveguide, the under cladding layer had a thickness of 20 µm; the cores were 40 µm thick by 40 µm wide; and the over cladding layer had a thickness (a thickness as measured from a top surface of the cores) of 30 µm, and a width of 1251.5 µm. A groove had a width of 500 µm, and was formed so as to extend along the entire length of the over cladding layer.

Example 2

Using the aforementioned materials, the opto-electric hybrid board shown in FIG. 5 was produced. The over cladding layer had a width of 160 μm. The remaining parts were the same as those in Example 1 described above.

Example 3

Using the aforementioned materials, the opto-electric hybrid board shown in FIG. 6 was produced. The under cladding layer had a width of 140 μm. The remaining parts were the same as those in Example 2 described above.

Example 4

Using the aforementioned materials, the opto-electric hybrid board shown in FIG. 7 was produced. Dimensions of the components were the same as those in Example 3 described above.

Comparative Example

An opto-electric hybrid board was configured such that an over cladding layer had no grooves in Example 1 described above. The remaining parts were the same as those in Example 1 described above.

[Radius of Curvature of Warpage]

The radii of curvature of warpage in the respective opto-electric hybrid boards in Examples 1 to 4 and Comparative Example were measured using a laser microscope (VK-X200 available from Keyence Corporation). The results were shown in TABLE 1 below.

TABLE 1

|  | Examples | | | | Comparative |
|---|---|---|---|---|---|
|  | 1 | 2 | 3 | 4 | example |
| Radius of curvature (mm) | 40 | 62 | 81 | 103 | 30 |

The results in TABLE 1 show that Examples 1 to 4 are greater in radius of curvature of warpage and accordingly smaller in warpage than Comparative Example.

Opto-electric hybrid boards in which the grooves were formed to extend partially in a longitudinal direction of the over cladding layer in Examples 1 to 4 also attained results having tendencies similar to those in Examples 1 to 4.

Further, opto-electric hybrid boards in which the grooves were formed only in a front surface portion of an over cladding layer in Examples 1 to 4 attained results having tendencies similar to those in Examples 1 to 4.

Also, opto-electric hybrid boards in which the metal layer is not disposed in Examples 1 to 4 attained results having tendencies similar to those in Examples 1 to 4.

Although specific forms in the present disclosure have been described in the aforementioned examples, the aforementioned examples should be considered as merely illustrative and not restrictive. It is contemplated that various modifications evident to those skilled in the art could be made without departing from the scope of the present disclosure.

The opto-electric hybrid board according to the present disclosure is applicable to eliminating or reducing warpage in the opto-electric hybrid board itself.

REFERENCE SIGNS LIST

E Electric circuit board
G Grooves
W Optical waveguide
3 Under cladding layer
4 Cores
5 Over cladding layer

The invention claimed is:

1. An opto-electric hybrid board comprising:
an electric circuit board; and
an optical waveguide formed in a stacked manner on one surface of the electric circuit board, the optical waveguide including
an under cladding layer formed on the one surface of the electric circuit board;
a core for an optical path formed on a front surface of the under cladding layer; and
an over cladding layer formed on the front surface of the under cladding layer and covering the front surface of the under cladding layer and the core,
wherein a groove having a bottom positioned below a top surface of the core is formed at least in a front surface portion of the over cladding layer, and
wherein a front surface portion in a side end portion of the under cladding layer is not covered with the over cladding layer and is exposed, the side end portion being disposed at a longitudinal position along a length of the core where at least a portion of a width of the under cladding layer covered by the over cladding layer, the width of the under cladding layer being a direction orthogonal to a longitudinal direction of the core.

2. The opto-electric hybrid board according to claim 1, wherein a longitudinal direction of the groove extends in the longitudinal direction of the core.

3. The opto-electric hybrid board according to claim 1, wherein warpage in the opto-electric hybrid board has a radius of curvature of not less than 35 mm.

* * * * *

UNITED STATES PATENT AND TRADEMARK OFFICE
CERTIFICATE OF CORRECTION

Page 1 of 1

PATENT NO. : 10,996,395 B2
APPLICATION NO. : 16/473799
DATED : May 4, 2021
INVENTOR(S) : Naoyuki Tanaka et al.

It is certified that error appears in the above-identified patent and that said Letters Patent is hereby corrected as shown below:

In the Claims

<u>At Column 10, Lines 41-42 (Claim 1):</u>
Change:
"under cladding layer covered by the over cladding layer"
To:
-- under cladding layer is covered by the over cladding layer --

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*